United States Patent
Ryoo et al.

(10) Patent No.: US 9,940,888 B2
(45) Date of Patent: Apr. 10, 2018

(54) DISPLAY DEVICE WITH SIGNAL LINES DETOURING AROUND OPENING INSIDE DISPLAY AREA

(71) Applicant: LG DISPLAY CO., LTD., Seoul (KR)

(72) Inventors: Seungseok Ryoo, Seoul (KR); Seeung Lee, Bucheon-si (KR); Chansoo Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/340,396

(22) Filed: Nov. 1, 2016

(65) Prior Publication Data
US 2017/0154566 A1 Jun. 1, 2017

(30) Foreign Application Priority Data
Dec. 1, 2015 (KR) ............... 10-2015-0169909

(51) Int. Cl.
 *G09G 3/36* (2006.01)
 *G02F 1/13* (2006.01)
(52) U.S. Cl.
 CPC ............ *G09G 3/3648* (2013.01); *G02F 1/13* (2013.01); *G09G 2300/0426* (2013.01)
(58) Field of Classification Search
 CPC . G09G 3/3648; G09G 2300/0426; G02F 1/13
 See application file for complete search history.

(56) References Cited

U.S. PATENT DOCUMENTS

| | | | |
|---|---|---|---|
| 8,890,181 B2* | 11/2014 | Wang | G07F 17/3211 257/88 |
| 2008/0225216 A1* | 9/2008 | Shimodaira | G02F 1/1345 349/143 |
| 2009/0051636 A1* | 2/2009 | Natori | G09G 3/3648 345/87 |
| 2010/0060842 A1* | 3/2010 | Igeta | G02F 1/1339 349/153 |

\* cited by examiner

*Primary Examiner* — Rodney Amadiz
(74) *Attorney, Agent, or Firm* — Dentons US LLP

(57) ABSTRACT

A display device is disclosed. The display device includes a substrate having an active area including a plurality of pixels, a bezel area positioned outside the active area, and at least one opening area positioned inside the active area, at least one opening positioned in the opening area, first signal lines arranged in a first direction and making a detour around the opening in the opening area, and second signal lines arranged in a second direction and making a detour around the opening in the opening area. The opening area includes a first opening area in which the first signal lines are arranged and which is adjacent to the opening, and a second opening area in which the second signal lines intersecting the first signal lines are arranged and which is spaced from the opening.

7 Claims, 14 Drawing Sheets

(a)

(b)

(c)

(a)

(b)

DISPLAY DEVICE WITH SIGNAL LINES DETOURING AROUND OPENING INSIDE DISPLAY AREA

This application claims the priority benefit of Korean Patent Application No. 10-2015-0169909 filed on Dec. 1, 2015 which is incorporated herein by reference for all purposes as if fully set forth herein.

BACKGROUND OF THE INVENTION

Field of the Invention

The present disclosure relates to a display device and a method of manufacturing the same, and more particularly, to a display device with reduced interference between signal lines.

Discussion of the Related Art

Various flat panel displays, which are replacing cathode ray tubes (CRTs) having disadvantages in weight and size, have been developed. Examples of flat panel displays include liquid crystal displays (LCDs), field emission displays (FEDs), plasma display panel (PDP), and organic light emitting diode (OLED) displays.

Because flat panel displays have advantages in thin profile and lightweight, flat panel displays have been frequently used as a display means for mobile terminals or portable information processing devices. In particular, a demand for displays having thin profile, light weight, lower power consumption, is increasing for portable devices or mobile terminals.

Flat panel displays have been applied to various fields including televisions, car displays, wearable devices, etc. as well as mobile terminals such as smart phones and tablet PCs. Various structural modifications are performed to apply these flat panel displays to various fields.

As for a display device having a specific shape different from existing display devices, a new arrangement of components constituting the display devices is typically desired. For example, a display device having a specific shape may need a new line arrangement structure different from existing display devices in which signal lines supplied with different signals (or voltages) are arranged in accordance with characteristics of the display device such as reducing interference between the signal lines.

SUMMARY

Accordingly, the present disclosure is directed to a display device and a method of manufacturing the same that substantially obviate one or more problems due to limitations and disadvantages of the related art.

An advantage of the present disclosure is to provide a display device with reduced interference between signal lines.

Additional features and advantages of the present disclosure will be set forth in the description which follows, and in part will be apparent from the description, or may be learned by practice of the invention. These and other advantages of the present invention will be realized and attained by the structure particularly pointed out in the written description and claims hereof as well as the appended drawings.

To achieve these and other advantages and in accordance with the purpose of embodiments of the invention, as embodied and broadly described herein, a display device may, for example, include a substrate having an active area including a plurality of pixels, a bezel area outside the active area, and at least one opening area inside the active area; at least one opening in the opening area; first signal lines arranged in a first direction and making a detour around the at least one opening in the opening area; and second signal lines arranged in a second direction and making a detour around the at least one opening in the opening area, wherein the at least one opening area includes: a first opening area in which the first signal lines are arranged and which is adjacent to the at least one opening; and a second opening area in which the second signal lines crossing the first signal lines are arranged and which is spaced from the at least one opening.

In this instance, the display device further includes data lines and gate lines configured to define the pixels through a crossing structure of the data lines and the gate lines, a data driving circuit configured to supply a data voltage to the pixels through the data lines, and a gate driving circuit configured to supply a gate pulse to the pixels through the gate lines. The first signal lines are one of the data lines and the gate lines, and the second signal lines are the other lines.

Alternatively, the first direction is the same direction as the second direction.

In this instance, the display device further includes data lines, vertical gate lines, and horizontal gate lines configured to define the pixels through a crossing structure of the data lines and the gate lines, a data driving circuit configured to supply a data voltage to the pixels through the data lines, and a gate driving circuit configured to supply a gate pulse to the pixels through the vertical gate lines. Two data lines are disposed at a first column boundary between a first pixel and a second pixel, that are adjacent to each other in a horizontal direction, and one vertical gate line is disposed at a second column boundary between the second pixel and a third pixel, that are adjacent to each other in the horizontal direction. The horizontal gate lines are respectively connected to the vertical gate lines through contact holes penetrating at least one insulating layer with the at least one insulating layer interposed between them. The first signal lines are one of the data lines and the vertical gate lines, and the second signal lines are the other lines.

A separation distance between the first signal lines is less than a separation distance between the adjacent first and second signal lines.

A separation distance between the second signal lines is less than a separation distance between the adjacent first and second signal lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Names of the respective elements used in the following explanations are selected only for convenience of writing the specification and may be thus different from those used in actual products.

The terms 'first', 'second', etc. may be used to describe various components, but the components are not limited by such terms. The terms are used only for the purpose of distinguishing one component from other components.

A display device according to an embodiment of the invention may be implemented based on a display device, such as a liquid crystal display (LCD), a plasma display panel (PDP), an organic light emitting diode (OLED) display, a field emission display (FED), an electrophoresis display, and a quantum dot display (QDD). In the following description, embodiments of the invention will be described using the liquid crystal display as an example of the display device. Other display devices may be used.

A display device according to an embodiment of the invention may be implemented in any known liquid crystal mode including a twisted nematic (TN) mode, a vertical alignment (VA) mode, an in-plane switching (IPS) mode, a fringe field switching (FFS) mode, etc. The display device according to the embodiment of the invention may be implemented as any type liquid crystal display including a transmissive liquid crystal display, a transflective liquid crystal display, and a reflective liquid crystal display.

Figure 1:
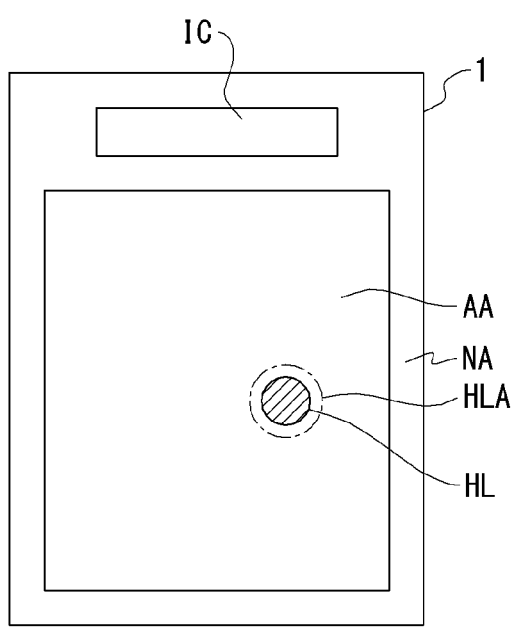
FIG. 1 is a plan view schematically illustrating a structure of a display device including an opening.

FIG. 1 is a plan view schematically illustrating a structure of a display device including an opening. As application fields of a display device are diversified, the display device may be variously changed. For example, an opening penetrating the display device may be processed.

Referring to FIG. 1, a display device according to an embodiment of the invention includes a substrate 1 having an active area AA and a bezel area NA outside the active area AA. The active area AA is a portion, on which an input image is displayed, and includes a plurality of pixels defined by a crossing structure of gate lines and data lines. In the bezel area NA, a plurality of driving elements for applying driving signals to the active area AA is disposed. For example, the bezel area NA may include a pixel driver IC for driving the pixels of the active area AA. The pixel driver IC may include a data driving circuit for supplying a data voltage to the data lines and a gate driving circuit for supplying a gate pulse to the gate lines.

At least one opening area HLA is formed inside the active area AA. The opening area HLA may be formed between the pixels. Namely, the opening area HLA may be formed on one side of the active area AA as well as the center of the active area AA. FIG. 1 illustrates the opening area HLA having an almost circular shape by way of example, but the embodiment of the invention is not limited thereto. The plan shape of the opening area HLA may vary depending on an arrangement pattern of signal lines making a detour around an opening HL.

Each opening area HLA may include at least one opening HL. The opening HL indicates a hole that is positioned inside the active area AA and penetrates the substrate 1. The opening HL may have a plan shape including a circle, a polygon, etc. In other words, the opening HL may have various shapes, if desired.

A sealant SSL (see FIG. 2) is applied to the opening area HLA along a circumference of the opening HL. The sealant SSL functions to seal a liquid crystal layer interposed between an upper substrate and a lower substrate of the display device. The sealant SSL is disposed between the opening HL and the signal lines making a detour around the opening HL.

The signal lines supplied with signals (or voltages) for driving the pixels are disposed in the active area AA. The signal lines adjacent to the opening HL are disposed to make the detour around the opening HL, so that the signal lines pass by the opening HL and supply the signals to other pixels.

If there is no opening HL in the active area AA, the signal lines supplied with different signals may be arranged to extend in one direction. However, when the opening HL is formed in the active area AA, a line arrangement structure different from a related art may be necessary for the signal lines because the signal lines have to make the detour around the opening HL.

Figure 2:
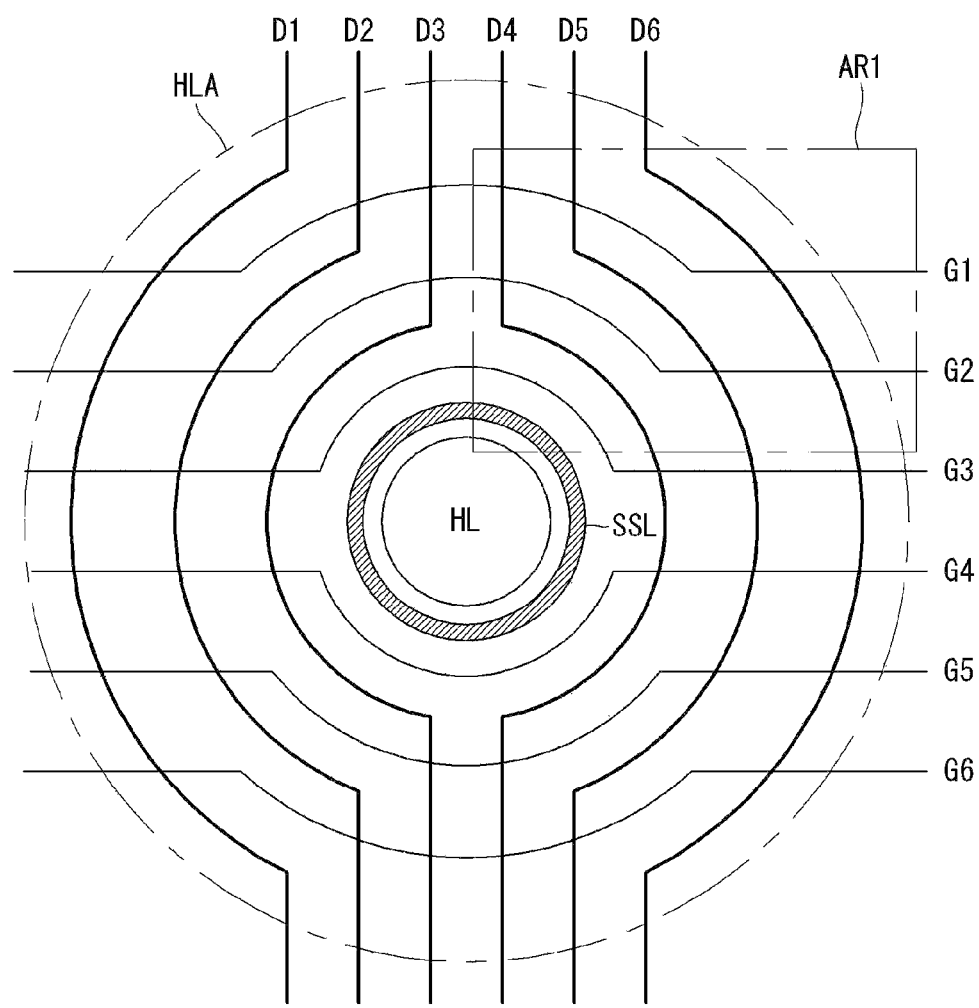
FIG. 2 illustrates a structure, in which signal lines make a detour around an opening.
Figure 3:
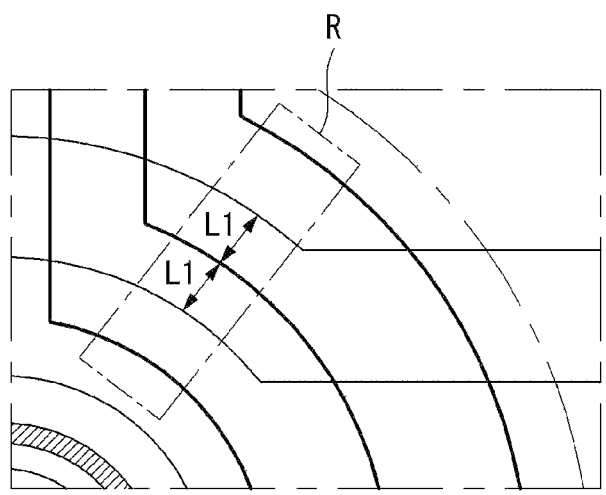
FIG. 3 is an enlarged view of an area AR1 shown in FIG. 2.

FIG. 2 illustrates a structure, in which signal lines make a detour around an opening. FIG. 3 is an enlarged view of an area AR1 shown in FIG. 2.

Referring to FIG. 2, gate lines G1 to G6 are extended in a first direction (for example, an x-axis direction) and making a detour around the opening HL in the opening area HLA. Gate lines G1 to G6 may be arranged along a circumference of the opening HL in the opening area HLA. The gate lines G1 to G6 are spaced from one another by a predetermined distance and extended in parallel with one another, so that they do not intersect one another. Further, data lines D1 to D6 are extended in a second direction (for example, a y-axis direction) and making a detour around the opening HL in the opening area HLA. Data lines D1 to D6 may be arranged along a circumference of the opening HL in the opening area HLA. The data lines D1 to D6 are spaced from one another by a predetermined distance and extended in parallel with one another, so that they do not intersect one another. The gate lines G1 to G6 and the data lines D1 to D6 intersect each other in a partial area. However, because the gate lines G1 to G6 and the data lines D1 to D6 are disposed on different layers, a short circuit is not generated between them.

As shown in FIG. 2, the gate lines G1 to G6 and the data lines D1 to D6 may be alternately arranged along the shape of the opening HL in a direction away from the opening HL. In this instance, the gate lines G1 to G6 and the data lines D1 to D6 supplied with different signals are disposed adjacent to each other. A parasitic capacitance may be necessarily generated between the gate lines G1 to G6 and the data lines D1 to D6, that are disposed adjacent to each other. Display quality (for example, luminance uniformity) of the display device may be reduced due to the parasitic capacitance between the gate lines G1 to G6 and the data lines D1 to D6. As the parasitic capacitance between the gate lines G1 to G6 and the data lines D1 to D6 increases, RC delay resulting from signal interference is generated. This makes it difficult to charge a predetermined pixel with a desired voltage level. In other words, a luminance of the predetermined pixel may be distorted due to the parasitic capacitance between the gate lines G1 to G6 and the data lines D1 to D6 that are disposed adjacent to each other.

Referring to FIG. 3, the gate lines G1 to G6 and the data lines D1 to D6 make the detour around the opening HL along the shape of the opening HL and are extended in parallel with each other in a partial area R. In the partial area R, because an overlap area between the gate lines G1 to G6 and the data lines D1 to D6 in a horizontal direction increases, a parasitic capacitance between the gate lines G1 to G6 and the data lines D1 to D6 increases. The parasitic capacitance further increases as the gate lines G1 to G6 and the data lines D1 to D6 are closer to each other. Thus, the gate lines G1 to G6 and the data lines D1 to D6 may be spaced from each other by a predetermined distance L1, so as to reduce the parasitic capacitance between the gate lines G1 to G6 and the data lines D1 to D6.

When the gate lines G1 to G6 and the data lines D1 to D6 are alternately disposed to be spaced from each other by the predetermined distance L1, an entire size of the opening area HLA increases. The opening area HLA is a non-display portion, on which an input image is not displayed. Namely, the pixel is not formed in the opening area HLA, and the signal lines making a detour around the opening HL are disposed in the opening area HLA. If a non-display portion is formed in the active area AA on which the input image is displayed, the non-display portion may be clearly perceived by a user and may reduce aesthetic impression of the display device.

As described above, when the gate lines G1 to G6 and the data lines D1 to D6 are alternately disposed in the opening area HLA, a reduction in the display quality resulting from the parasitic capacitance and an increase in an area occupied by the opening area HLA have a trade-off. Thus, a new line arrangement structure is desired to reduce the parasitic capacitance between the gate lines G1 to G6 and the data lines D1 to D6 without increasing the size of the opening area HLA.

The display device according to the embodiment of the invention can reduce a size of an opening area while preventing or reducing a quality reduction resulting from a parasitic capacitance generated when first signal lines and second signal lines are disposed adjacent to each other in the opening area. For example, the first signal lines may be data lines supplied with a data voltage, and the second signal lines may be gate lines supplied with a gate pulse.

The embodiment of the invention separately disposes the first signal lines and the second signal lines. More specifically, the first signal lines, that are extended in a first direction while making a detour around an opening, and the second signal lines, that are extended in a second direction while making a detour around the opening, are dividedly disposed in a first opening area and a second opening area, respectively. The first direction and the second direction may intersect each other or may be parallel to each other. Namely, the first direction and the second direction may be different directions or the same direction.

The first signal lines in the first opening area are spaced from one another by a predetermined distance and disposed in parallel with one another. The predetermined distance indicates a minimum separation distance between the first signal lines to the extent that the first signal lines are not short-circuited from one another. The second signal lines in the second opening area are spaced from one another by a predetermined distance and disposed in parallel with one another. The predetermined distance indicates a minimum separation distance between the second signal lines to the extent that the second signal lines are not short-circuited from one another.

In this instance, the gate lines and the data lines are disposed adjacent to each other in parallel with each other in an area adjacent to a boundary between the first opening area and the second opening area. In the embodiment of the invention, the gate line and the data line may be spaced from each other by a predetermined distance, so as to reduce a parasitic capacitance between the gate line and the data line adjacent to the boundary. The predetermined distance indicates a minimum separation distance between the gate line and the data line capable of reducing the quality reduction attributable to the parasitic capacitance between the gate line and the data line adjacent to the boundary.

The embodiment of the invention can reduce the parasitic capacitance between the gate line and the data line by spacing the gate line and the data line from each other. Further, the embodiment of the invention can minimize the size of the opening area by limiting an area adjacent to the gate line and the data line to a boundary area.

Structures of a pixel array described below are merely examples of explaining characteristics of embodiments of the invention. Embodiments of the invention are not limited to them. For example, embodiments of the invention may include a pixel array structure, in which first signal lines and second signal lines are extended in different directions, and a pixel array structure, in which first signal lines and second signal lines are extended in the same directions.

First Embodiment

Figure 4:
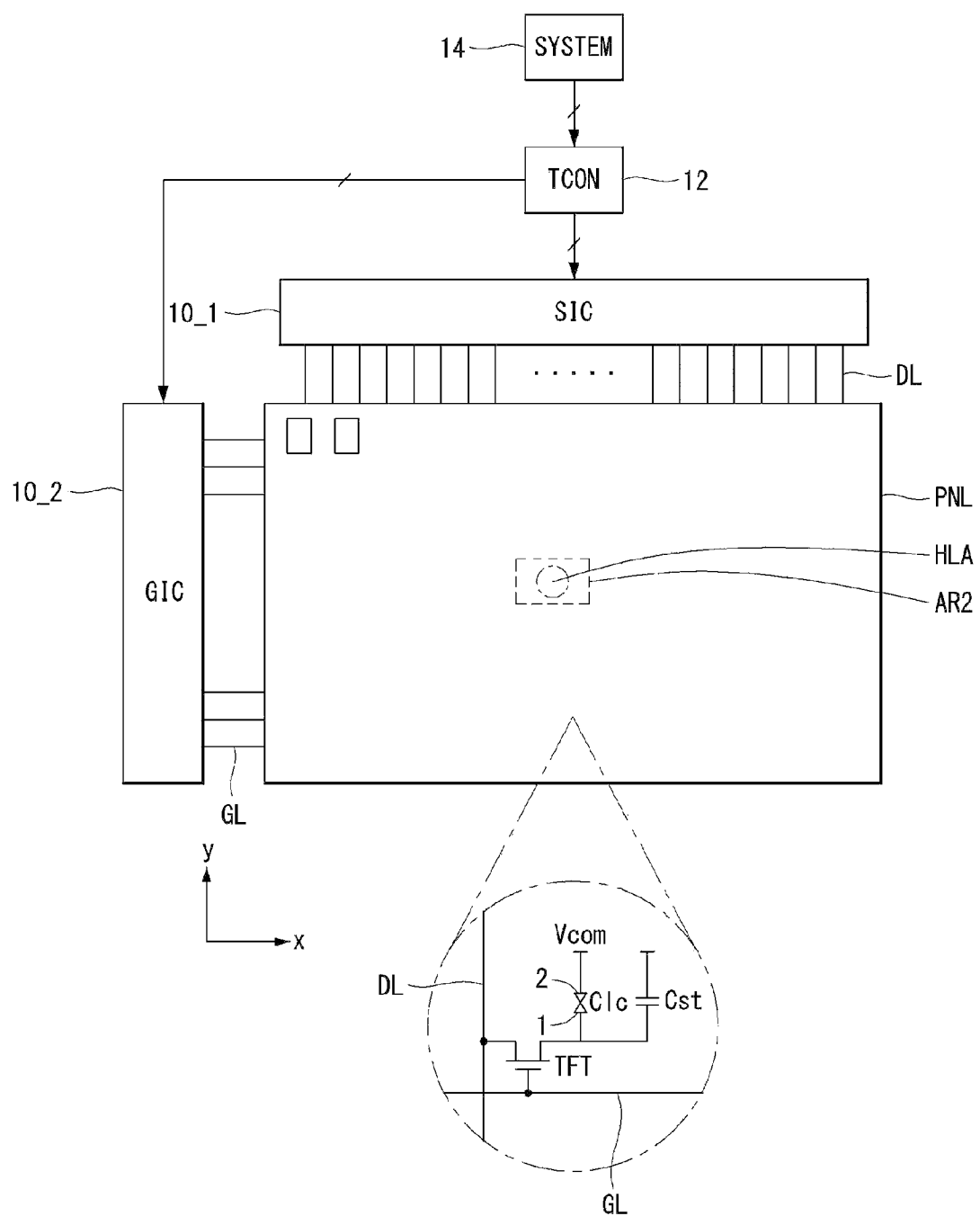
FIG. 4 is a block diagram schematically illustrating a display device according to the first embodiment of the invention.

A display device according to a first embodiment of the invention is described below with reference to FIGS. 4 to 7. FIG. 4 is a block diagram schematically illustrating a display device according to a first embodiment of the invention.

Referring to FIG. 4, a display device according to a first embodiment of the invention includes a display panel PNL, a driver integrated circuit (IC), a timing controller 12 (or denoted as "TCON"), and the like.

The display panel PNL includes an upper substrate and a lower substrate that are positioned opposite each other with liquid crystal cells Clc interposed between them. Image data is displayed on a pixel array area of the display panel PNL, in which pixels are disposed in a matrix. A pixel array includes a thin film transistor (TFT) array formed on the lower substrate and a color filter array formed on the upper substrate. Color filters may be formed on the TFT array of the lower substrate using a COT (Color Filter on TFT) process.

The TFT array includes vertical lines and horizontal lines. The vertical lines are formed along a vertical direction (for example, a y-axis direction) of the display panel PNL. The horizontal lines are formed along a horizontal direction (for example, an x-axis direction) of the display panel PNL and intersect the vertical lines. The vertical lines include data lines DL supplied with a data voltage, and the horizontal lines include gate lines GL supplied with a gate pulse.

The TFT array includes TFTs respectively formed at crossings of the data lines DL and the gate lines GL. The TFT supplies the data voltage from the data line DL to a pixel electrode 1 of the liquid crystal cell Clc in response to the gate pulse from the gate line GL. Each liquid crystal cell Clc is driven by a voltage difference between the pixel electrode 1 charged with the data voltage through the TFT and a common electrode 2 supplied with a common voltage Vcom. A storage capacitor Cst is connected to the liquid crystal cell Clc and holds a voltage of the liquid crystal cell Clc during one frame period. Polarizing plates are respectively attached to the upper substrate and the lower substrate of the display panel PNL. Alignment layers for setting a pre-tilt angle of liquid crystals are respectively formed on the upper substrate and the lower substrate of the display panel PNL.

The driver IC is a driving circuit for driving the display panel PNL and includes a source driver IC SIC (or denoted as "10_1") and a gate driver IC GIC (or denoted as "10_2"). The source driver IC SIC and the gate driver IC GIC may be together mounted on a flexible circuit board, for example, a chip-on film (COF). An input terminal of the COF may be attached to a printed circuit board (PCB), and an output terminal of the COF may be attached to the lower substrate of the display panel PNL. The gate driver IC GIC may be directly formed in a bezel area of the display panel PNL using a GIP (gate-driver in panel) circuit manner.

The source driver IC SIC samples and latches digital video data of an input image under the control of the timing controller 12 and converts the latched digital video data into parallel data. The source driver IC SIC converts the digital video data into an analog gamma compensation voltage using a digital-to-analog converter (DAC) under the control of the timing controller 12 and generates a data voltage. The source driver IC SIC then supplies the data voltage to the data lines DL. The gate driver IC GIC sequentially supplies a gate pulse (or a scan pulse) synchronized with the data voltage to the gate lines GL under the control of the timing controller 12.

The timing controller 12 receives digital video data of an input image from a host system 14 and transmits the digital video data to the source driver IC SIC. The timing controller 12 receives timing signals, such as a vertical sync signal Vsync, a horizontal sync signal Hsync, a data enable signal DE, and a main clock CLK, from the host system 14. The timing signals are synchronized with the digital video data of the input image. The timing controller 12 generates a source timing control signal for controlling operation timing of the source driver IC SIC and a gate timing control signal for controlling operation timing of the gate driver IC GIC using the timing signals Vsync, Hsync, DE, and CLK.

The host system 14 may be one of a television system, a set-top box, a navigation system, a DVD player, a Blu-ray player, a personal computer (PC), a home theater system, a phone system, and other systems that include or operate in conjunction with a display. The host system 14 converts digital video data of an input image into data of a format suitable for the display panel PNL. The host system 14 transmits the digital video data of the input image and the timing signals Vsync, Hsync, DE, and CLK to the timing controller 12.

Figure 5:
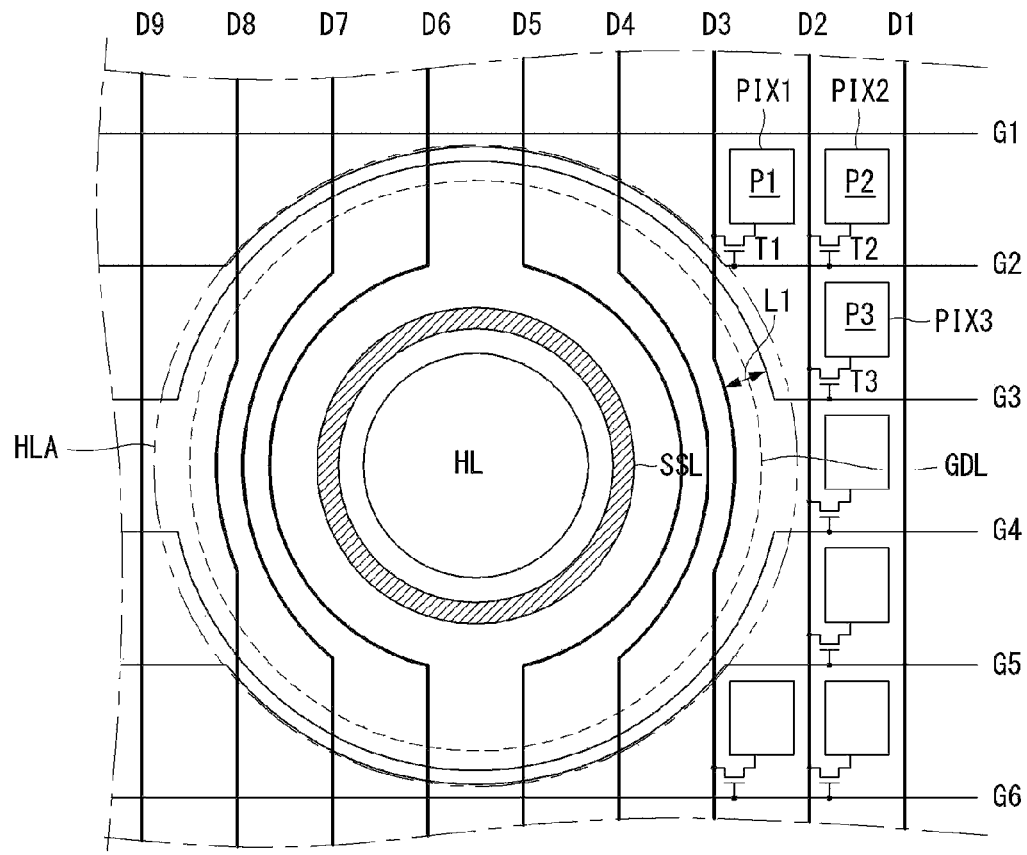
FIG. 5 is an equivalent circuit diagram illustrating a portion of a pixel array according to the first embodiment of the invention.
Figure 6:
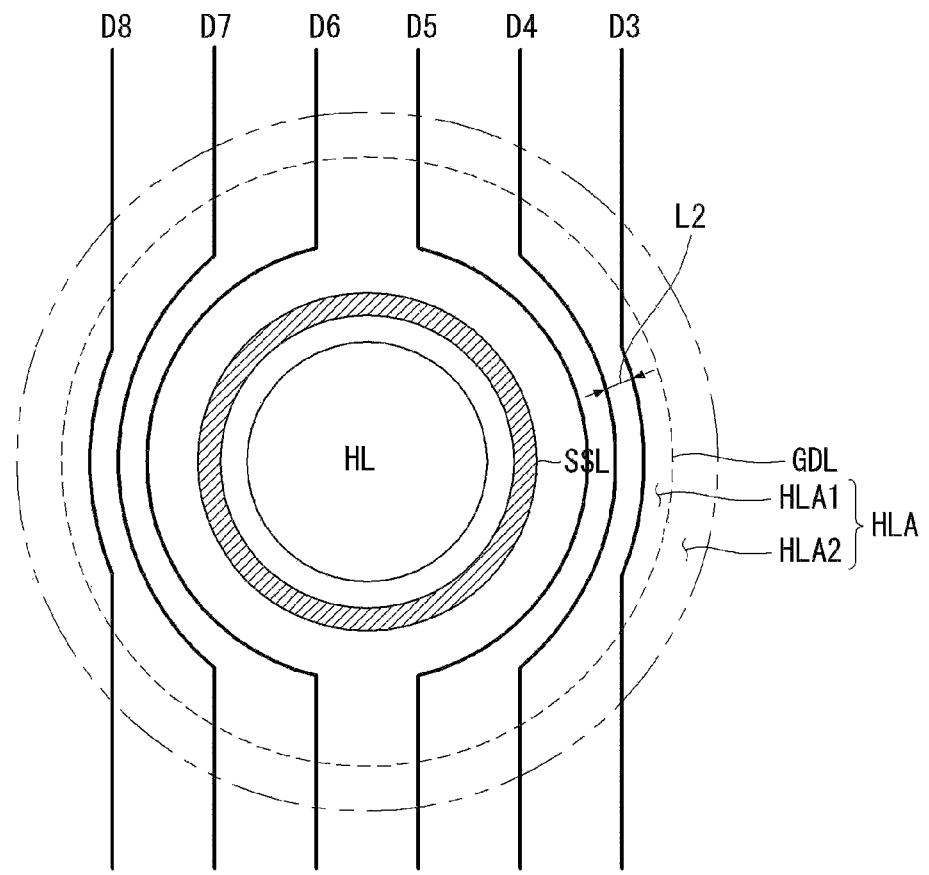
FIGS. 6 and 7 illustrate an opening area and signal lines across an opening area according to the first embodiment of the invention.
Figure 7:
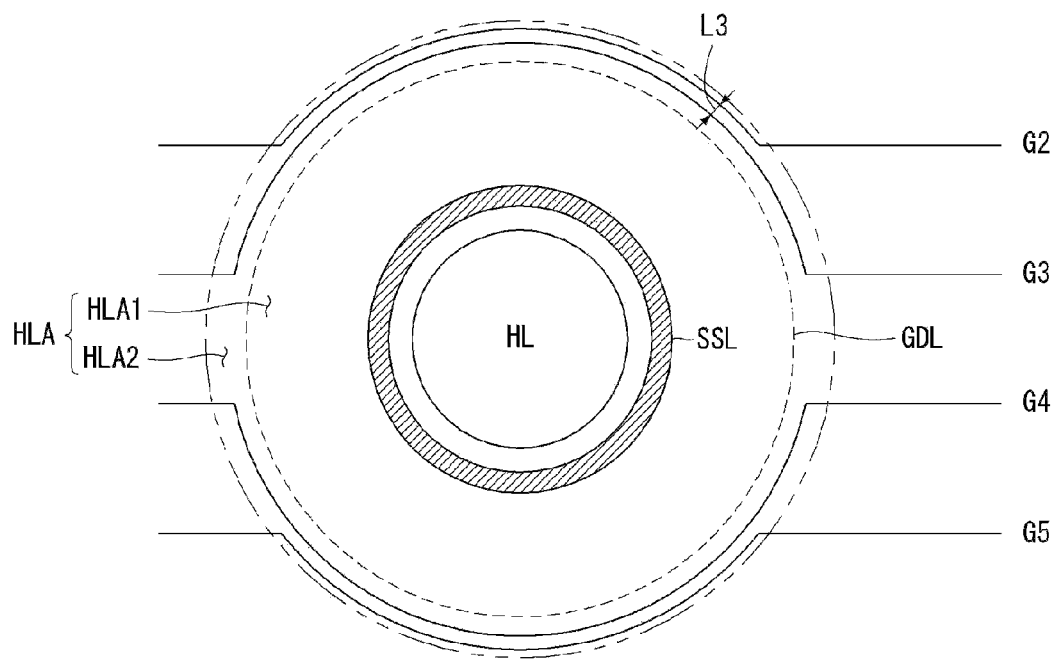

FIG. 5 is an equivalent circuit diagram illustrating a portion of a pixel array according to the first embodiment of the invention. FIGS. 6 and 7 illustrate an opening area and signal lines across an opening area according to the first embodiment of the invention. In FIGS. 5 to 7, "D1 to D9" are data lines, and "G1 to G6" are gate lines.

In FIG. 5, "T1" and "PIX1" denote a TFT and a pixel electrode of a first pixel P1, respectively; "T2" and "PIX2" denote a TFT and a pixel electrode of a second pixel P2, respectively; and "T3" and "PIX3" denote a TFT and a pixel electrode of a third pixel P3, respectively.

The TFT T1 of the first pixel P1 supplies a data voltage from the third data line D3 to the pixel electrode PIX1 in response to a gate pulse from the second gate line G2. The TFT T1 may include a gate electrode integrated with the second gate line G2, a drain electrode integrated with the third data line D3, and a source electrode connected to the pixel electrode PIX1.

The TFT T2 of the second pixel P2 supplies a data voltage from the second data line D2 to the pixel electrode PIX2 in response to a gate pulse from the second gate line G2. The TFT T2 may include a gate electrode integrated with the second gate line G2, a drain electrode integrated with the second data line D2, and a source electrode connected to the pixel electrode PIX2.

The TFT T3 of the third pixel P3 supplies a data voltage from the second data line D2 to the pixel electrode PIX3 in response to a gate pulse from the third gate line G3. The TFT T3 may include a gate electrode integrated with the third gate line G3, a drain electrode integrated with the second data line D2, and a source electrode connected to the pixel electrode PIX3.

The pixel array further includes a common electrode (not shown) supplied with a common voltage Vcom. The common electrode forms an electric field together with the pixel electrodes PIX1, PIX2, and PIX3 and drives liquid crystal molecules.

Referring to FIGS. 6 and 7, an opening area HLA includes at least one opening HL. For convenience of explanation, the following description will be given on the assumption that one opening HL is formed in one opening area HLA. The opening area HLA includes a first opening area HLA1 and a second opening area HLA2. The first opening area HLA1 is positioned adjacent to the opening HL. The second opening area HLA2 is positioned outside the first opening area HLA1 and is spaced from the opening HL by a predetermined distance. Namely, the opening area HLA is divided into the first opening area HLA1 adjacent to the opening HL and the second opening area HLA2 spaced from the opening HL with a boundary GDL interposed between them.

The display device according to the first embodiment of the invention includes the data lines D1 to D9 extended in the vertical direction and the gate lines G1 to G6, that are extended in the horizontal direction and are intersected with the data lines D1 to D9. The data voltage may be supplied to one end or both ends of each of the data lines D1 to D9 extended in the vertical direction. The gate pulse may be supplied to one end or both ends of each of the gate lines G1 to G6 extended in the horizontal direction.

The data lines D3 to D8 are disposed in the first opening area HLA1. The data lines D3 to D8 are extended along the vertical direction and making a detour around the opening HL in the first opening area HLA1. The data lines D3 to D8 may be arranged along a circumference of the opening HL in the first opening area HLA1. The data lines D3 to D8 making the detour around the opening HL may be disposed at intervals of a minimum distance L2 (see FIG. 6) to the extent that they are not short-circuited from one another. The separation distance L2 between the data lines D3 to D8 is shorter than a separation distance L1 (see FIG. 5) between the gate lines G2 to G5 and the data lines D3 to D8 to reduce a parasitic capacitance between the gate lines G2 to G5 and the data lines D3 to D8.

The gate lines G2 to G5 are disposed in the second opening area HLA2. The gate lines G2 to G5 are extended along the horizontal direction and making a detour around the opening HL in the second opening area HLA2. The gate lines G2 to G5 may be arranged along a circumference of the opening HL in the second opening area HLA2. The gate lines G2 to G5 making the detour around the opening HL may be disposed at intervals of a minimum distance L3 (see FIG. 7) to the extent that they are not short-circuited from one another. The separation distance L3 between the gate lines G2 to G5 is shorter than the separation distance L1 to reduce the parasitic capacitance between the gate lines G2 to G5 and the data lines D3 to D8.

At least one of the gate lines G2 to G5 making the detour around the opening HL in the second opening area HLA2 intersects at least one of the data lines D3 to D8 extended along the vertical direction. In this instance, the data lines D3 to D8 and the gate lines G2 to G5 intersect each other in the second opening area HLA2, but are not arranged in parallel with each other in the second opening area HLA2. Therefore, the parasitic capacitance between the data lines D3 to D8 and the gate lines G2 to G5 is not large.

FIGS. 5 to 7 illustrate that signal lines making a detour around the opening HL are arranged along a shape of the opening HL. The embodiment of the invention is not limited thereto. For example, the signal lines making the detour around the opening HL may have various shapes including a straight line, a curved line, or a combination thereof, etc. around the opening HL.

The data lines D3 and D8 disposed on an outermost side of the first opening area HLA1 and the gate lines G3 and G4 disposed on an innermost side of the second opening area HLA2 are arranged in parallel with each other along the circumference of the opening HL in a partial area. Namely, the data lines D3 and D8 and the gate lines G3 and G4 adjacent to the boundary GDL between the first opening area HLA1 and the second opening area HLA2 are arranged in parallel with each other in the partial area. The data lines D3 and D8 and the gate lines G3 and G4 adjacent to the boundary GDL are spaced from each other by the predetermined distance L1, so as to reduce a parasitic capacitance between the data lines D3 and D8 and the gate lines G3 and G4 adjacent to the boundary GDL.

As described above, in the first embodiment of the invention, an area, in which the data lines D3 and D8 and the gate lines G3 and G4 are arranged are adjacent to each other in the opening area HLA, is a portion, in which the boundary GDL between the first opening area HLA1 and the second opening area HLA2 is defined. Namely, a size of the opening area HLA is greatly reduced, compared to a size of an area, in which the gate lines G1 to G6 (see FIG. 2) and the data lines D1 to D6 (see FIG. 2) are disposed in parallel with each other, when the gate lines G1 to G6 and the data lines D1 to D6 are alternately arranged while making a detour around the opening HL. In other words, the first embodiment of the invention is configured such that the data lines D3 and D8 and the gate lines G3 and G4 are positioned adjacent to each other in a portion around the boundary GDL between the first opening area HLA1 and the second opening area HLA2. The first embodiment of the invention can limit an area, in which the data lines D3 and D8 and the gate lines G3 and G4 are positioned adjacent to each other, to a portion around the boundary GDL by dividedly disposing the data lines D3 to D8 and the gate lines G2 to G5.

Accordingly, the first embodiment of the invention can easily reduce a parasitic capacitance by securing a predetermined separation distance between the data lines D3 and D8 and the gate lines G3 and G4 adjacent to the boundary GDL. The first embodiment of the invention can a display device with improved aesthetic impression by reducing a size of the opening area HLA, that is a non-display portion, while easily charging a predetermined pixel with a desired voltage level by reducing a parasitic capacitance between the signal lines arranged along the circumference of the opening HL.

The first embodiment of the invention described that only the data lines extended in the vertical direction are disposed in the first opening area, by way of example, but is not limited thereto. For example, the gate lines extended in the horizontal direction may be disposed in the first opening area while making a detour around the opening. In this instance, the data lines may be disposed in the second opening area while making a detour around the opening and may be intersected with the gate lines.

The embodiment of the invention can minimize a size of the opening area while reducing signal interference between the adjacent signal lines by employing a new line arrangement structure making a detour around the opening. Hence, the embodiment of the invention can prevent a reduction (for example, luminance non-uniformity) in the display quality of the display device and can improve the aesthetic impression by reducing a size of the opening area that is the non-display area.

Second Embodiment

Figure 8:
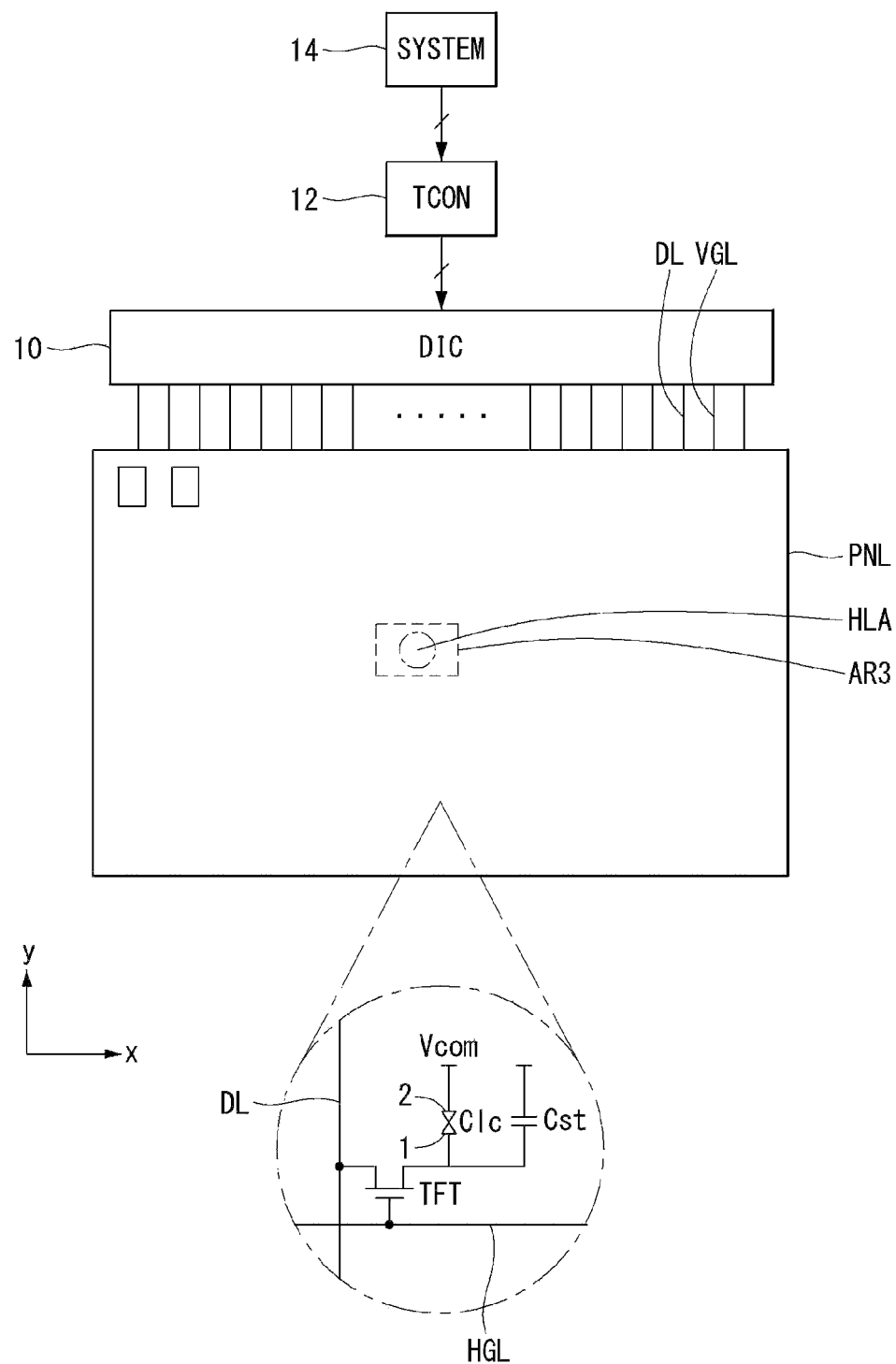
FIG. 8 is a block diagram schematically illustrating a display device according to the second embodiment of the invention.
Figure 9:
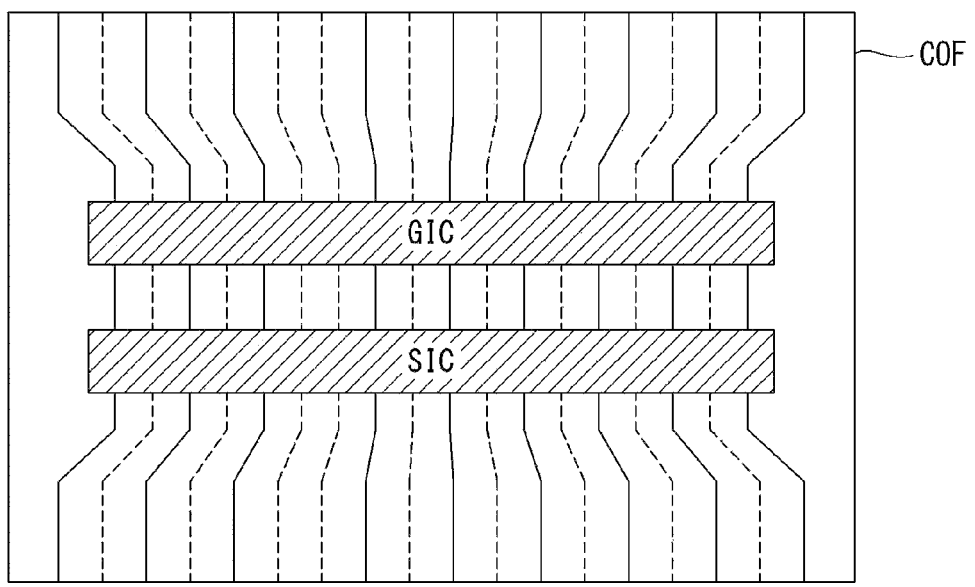
FIG. 9 is an enlarged view of a chip-on film (COF) connected to a display panel illustrated in FIG. 8.

A display device according to a second embodiment of the invention is described below with reference to FIGS. 8 to 12. FIG. 8 is a block diagram schematically illustrating a display device according to a second embodiment of the invention. FIG. 9 is an enlarged view of a chip-on film (COF) connected to a display panel shown in FIG. 8.

Referring to FIG. 8, a display device according to a second embodiment of the invention includes a display panel PNL, a driver IC 10 (or denoted as "DIC"), a timing controller 12 (or denoted as "TCON"), and the like.

The display panel PNL includes an upper substrate and a lower substrate that are positioned opposite each other with liquid crystal cells Clc interposed between them. Image data is displayed on a pixel array area of the display panel PNL, in which pixels are disposed in a matrix. A pixel array includes a thin film transistor (TFT) array formed on the lower substrate and a color filter array formed on the upper substrate. Color filters may be formed on the TFT array of the lower substrate using a COT (Color Filter on TFT) process.

The TFT array includes vertical lines and horizontal lines. The vertical lines are formed along a vertical direction (for example, a y-axis direction) of the display panel PNL. The horizontal lines are formed along a horizontal direction (for example, an x-axis direction) of the display panel PNL and intersect the vertical lines. The vertical lines include data lines DL and vertical gate lines VGL. The horizontal lines include horizontal gate lines HGL supplied with a gate pulse through the vertical gate lines VGL. The horizontal gate lines HGL are respectively connected to the vertical gate lines VGL through contact holes CONT1 (see FIG. 10) and are supplied with the gate pulse through the vertical gate lines VGL.

The TFT array includes TFTs respectively formed at crossings of the data lines DL and the horizontal gate lines HGL. The TFT supplies a data voltage from the data line DL to a pixel electrode 1 of the liquid crystal cell Clc in response to the gate pulse from the horizontal gate line HGL. Each liquid crystal cell Clc is driven by a voltage difference between the pixel electrode 1 charged with the data voltage through the TFT and a common electrode 2 supplied with a common voltage Vcom. A storage capacitor Cst is connected to the liquid crystal cell Clc and holds a voltage of the liquid crystal cell Clc during one frame period. Polarizing plates are respectively attached to the upper substrate and the lower substrate of the display panel PNL. Alignment layers for setting a pre-tilt angle of liquid crystals are respectively formed on the upper substrate and the lower substrate of the display panel PNL.

The driver IC 10 is a driving circuit for driving the display panel PNL and includes a source driver IC SIC and a gate driver IC GIC. The source driver IC SIC and the gate driver IC GIC may be together mounted on a flexible circuit board, for example, a chip-on film (COF). An input terminal of the COF may be attached to a printed circuit board (PCB), and an output terminal of the COF may be attached to the lower substrate of the display panel PNL. In order to electrically separate signal lines (indicated by dotted line in FIG. 9) connected to the source driver IC SIC and signal lines (indicated by solid line in FIG. 9) connected to the gate driver IC GIC from each other, an insulating layer is formed between the signal lines on the COF.

The source driver IC SIC samples and latches digital video data of an input image under the control of the timing controller 12 and converts the latched digital video data into parallel data. The source driver IC SIC converts the digital video data into an analog gamma compensation voltage using a digital-to-analog converter (DAC) under the control of the timing controller 12 and generates a data voltage. The source driver IC SIC then supplies the data voltage to the data lines DL. The gate driver IC GIC sequentially supplies a gate pulse (or a scan pulse) synchronized with the data voltage to the vertical gate lines VGL under the control of the timing controller 12.

All of the driver ICs are formed on the COF connected to an upper side or a lower side of the display panel PNL, and the gate pulse is supplied to the horizontal gate lines HGL through the vertical gate lines VGL. Thus, the gate driver IC may not need to be attached or embedded to a left edge and a right edge of the display panel PNL, and routing lines connecting the horizontal gate lines HGL and the gate driver IC are not formed at the left edge and the right edge of the display panel PNL. As a result, a width of a remaining portion of a bezel area of the display panel PNL except a portion of the bezel area connected to the COF can be minimized.

Figure 10:
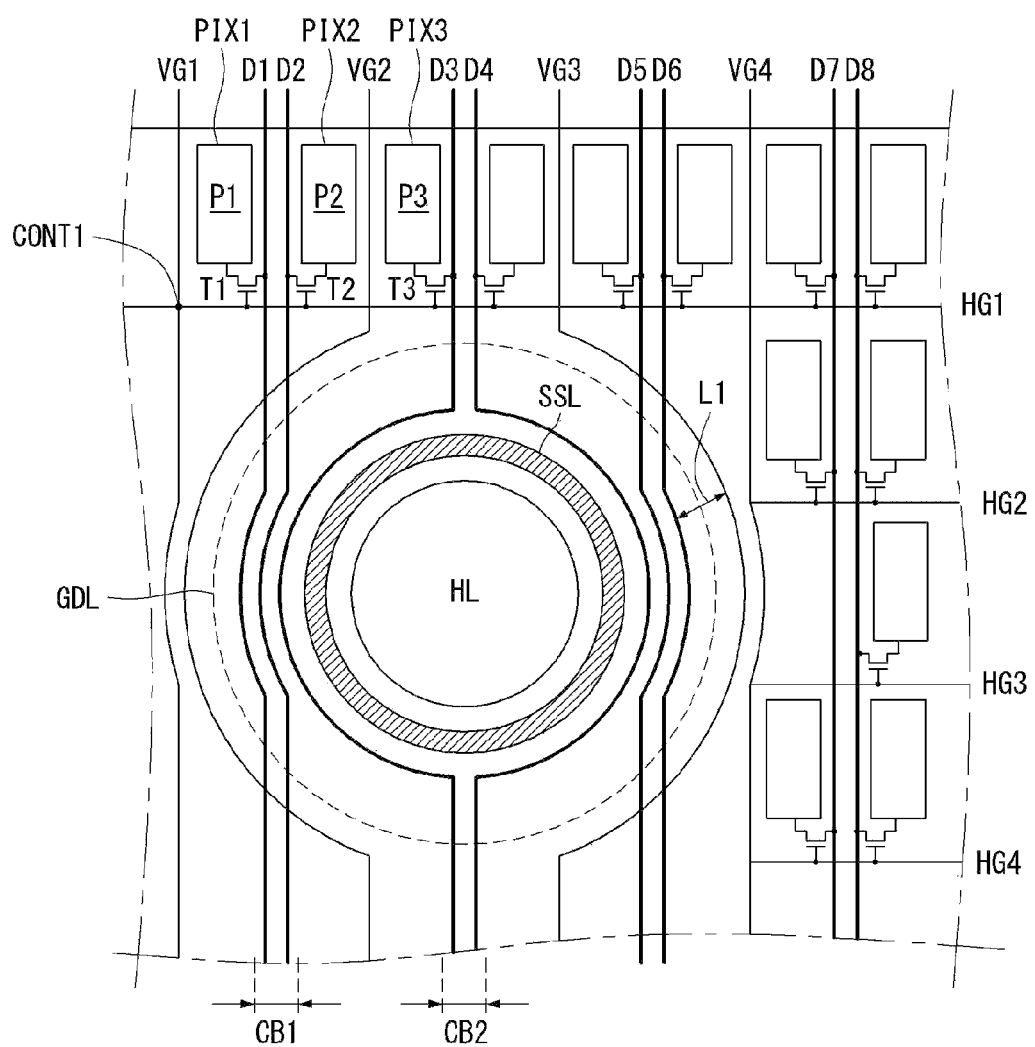
FIG. 10 is an equivalent circuit diagram illustrating a portion of a pixel array according to the second embodiment of the invention.
Figure 11:
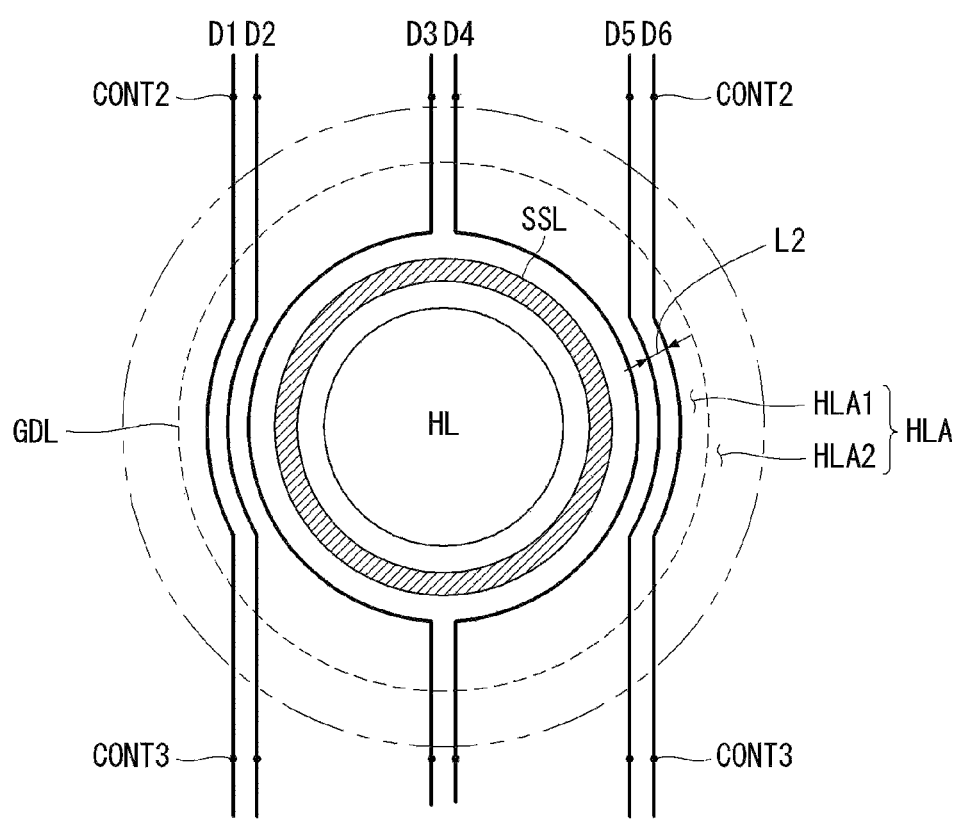
FIGS. 11 and 12 illustrate an opening area and signal lines across an opening area according to the second embodiment of the invention.
Figure 12:
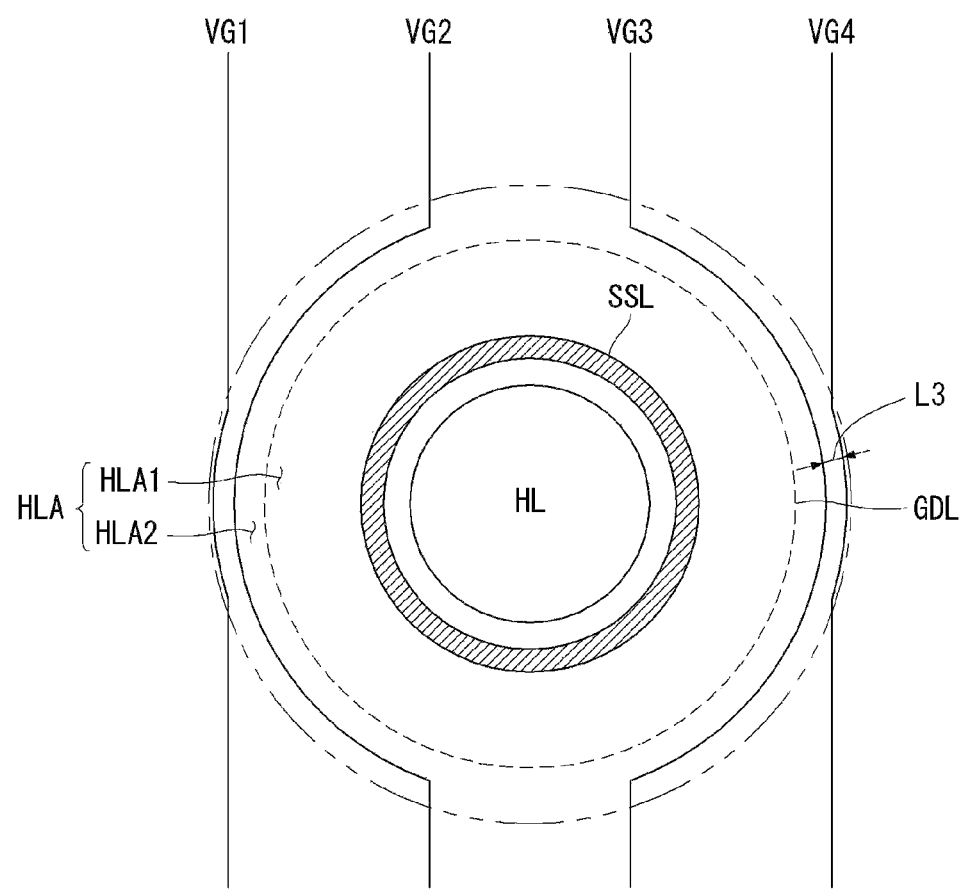

FIG. 10 is an equivalent circuit diagram illustrating a portion of a pixel array according to the second embodiment of the invention. FIGS. 11 and 12 illustrate an opening area and signal lines across an opening area according to the second embodiment of the invention. In FIGS. 10 to 12, "D1 to D8" denote the data lines, "VG1 to VG4" denote the vertical gate lines, and "HG1 to HG4" denote the horizontal gate lines.

Referring to FIG. 10, one vertical gate line or two data lines are formed between pixels, that are adjacent to each other in the horizontal direction. For example, as shown in FIG. 10, when first to third pixels P1 to P3 are disposed on one line in a row, the two data lines D1 and D2 are formed at a first column boundary CB1 between the adjacent first and second pixels P1 and P2. On the other hand, one vertical gate line VG2 is formed at a second column boundary CB2 between the adjacent second and third pixels P2 and P3. The vertical gate lines VG1 to VG4 are respectively connected to the horizontal gate lines HG1 to HG4 through the contact holes CONT1. The TFT are not connected to the vertical gate lines VG1 to VG4.

In FIG. 10, "T1" and "PIX1" denote a TFT and a pixel electrode of the first pixel P1, respectively; "T2" and "PIX2" denote a TFT and a pixel electrode of the second pixel P2, respectively; and "T3" and "PIX3" denote a TFT and a pixel electrode of the third pixel P3, respectively. A connection relationship between the first and second pixels P1 and P2 is described below. The TFT T1 and the pixel electrode PIX1 of the first pixel P1 are disposed on the left side of the first data line DE The TFT T1 supplies a data voltage from the first data line D1 to the pixel electrode PIX1 in response to a first gate pulse from the first horizontal gate line HG1. The TFT T1 may include a gate electrode integrated with the first horizontal gate line HG1, a drain electrode integrated with the first data line D1, and a source electrode connected to the pixel electrode PIX1. The TFT T2 and the pixel electrode PIX2 of the second pixel P2 are disposed on the right side of the second data line D2. The TFT T2 supplies a data voltage from the second data line D2 to the pixel electrode PIX2 in response to the first gate pulse from the first horizontal gate line HG1. The TFT T2 may include a gate electrode integrated with the first horizontal gate line HG1, a drain electrode integrated with the second data line D2, and a source electrode connected to the pixel electrode PIX2.

A common electrode supply line (not shown) supplied with a common voltage Vcom is formed using the same gate metal as the horizontal gate lines HG1 to HG4. The common electrode supply line is connected to a common electrode (not shown) formed in each of the pixels P1, P2, and P3 through a contact hole and distributes the common voltage Vcom to the pixels P1, P2, and P3. The common electrode forms an electric field together with the pixel electrodes PIX1 and PIX2 and drives liquid crystal molecules.

Referring to FIGS. 11 and 12, an opening area HLA includes at least one opening HL. For convenience of explanation, the following description will be given on the assumption that one opening HL is formed in one opening area HLA. The opening area HLA includes a first opening area HLA1 and a second opening area HLA2. The first opening area HLA1 is positioned adjacent to the opening HL. The second opening area HLA2 is positioned outside the first opening area HLA1 and is spaced from the opening HL by a predetermined distance. Namely, the opening area HLA is divided into the first opening area HLA1 adjacent to the opening HL and the second opening area HLA2 spaced from the opening HL with a boundary GDL interposed between them.

The display device according to the second embodiment of the invention includes the data lines D1 to D8 and the vertical gate lines VG1 to VG4, that are extended in the vertical direction, and the horizontal gate lines HG1 to HG4, that are extended in the horizontal direction and are intersected with the data lines D1 to D8 and the vertical gate lines VG1 to VG4. The data voltage may be supplied to one end or both ends of each of the data lines D1 to D8 extended in the vertical direction. The gate pulse may be supplied to one end or both ends of each of the vertical gate lines VG1 to VG4 extended in the vertical direction. The horizontal gate lines HG1 to HG4 are respectively connected to the vertical gate lines VG1 to VG4 through the contact holes CONT1 (see FIG. 10) and are supplied with the gate pulse through the vertical gate lines VG1 to VG4.

The data lines D1 to D6 are disposed in the first opening area HLA1. The data lines D1 to D6 are extended along the vertical direction and making a detour around the opening HL in the first opening area HLA1. The data lines D1 to D6 may be arranged along a circumference of the opening HL in the first opening area HLA1. The data lines D1 to D6 making the detour around the opening HL may be disposed at intervals of a minimum distance L2 (see FIG. 11) to the extent that they are not short-circuited from one another. The separation distance L2 between the data lines D1 to D6 is shorter than a separation distance L1 (see FIG. 10) between the vertical gate lines VG1 to VG4 and the data lines D1 to D6 to reduce a parasitic capacitance between the vertical gate lines VG1 to VG4 and the data lines D1 to D6.

The vertical gate lines VG1 to VG4 are disposed in the second opening area HLA2. The vertical gate lines VG1 to VG4 are extended along the vertical direction and making a detour around the opening HL in the second opening area HLA2. The vertical gate lines VG1 to VG4 may be arranged along a circumference of the opening HL in the second opening area HLA2. The vertical gate lines VG1 to VG4 making the detour around the opening HL may be disposed at intervals of a minimum distance L3 (see FIG. 12) to the extent that they are not short-circuited from one another. The separation distance L3 between the vertical gate lines VG1 to VG4 is shorter than the separation distance L1 to reduce the parasitic capacitance between the vertical gate lines VG1 to VG4 and the data lines D1 to D6.

At least one of the vertical gate lines VG1 to VG4 making the detour around the opening HL in the second opening area HLA2 intersects at least one of the data lines D1 to D6 extended along the vertical direction. In this instance, the data lines D1 to D6 and the vertical gate lines VG1 to VG4 intersect each other in the second opening area HLA2, but are not arranged in parallel with each other in the second opening area HLA2. Therefore, the parasitic capacitance between the data lines D1 to D6 and the vertical gate lines VG1 to VG4 is not large.

FIGS. 10 to 12 illustrate that signal lines making a detour around the opening HL are arranged along a shape of the opening HL. The embodiment of the invention is not limited thereto. For example, the signal lines making the detour around the opening HL may have various shapes including a straight line, a curved line, or a combination thereof, etc. around the opening HL.

In the second embodiment of the invention, the vertical gate lines VG1 to VG4 and the data lines D1 to D8 may be formed on the same layer. In this instance, the vertical gate lines VG1 to VG4 and the data lines D1 to D6 making the detour around the opening HL may intersect each other and may be short-circuited in the second opening area HLA2.

In order to prevent the short circuit, the display device according to the second embodiment of the invention may further include data routing lines connected to the data lines D1 to D6. One end of each data routing line is connected to the corresponding data line through a contact hole CONT2 penetrating an insulating layer with at least one insulating layer interposed between them. The other end of each data routing line is connected to the corresponding data line through a contact hole CONT3 penetrating an insulating layer with at least one insulating layer interposed between them. The contact holes CONT2 and CONT3 may be formed inside and outside the opening area HLA. It may be preferable, but not required, that the contact holes CONT2 and CONT3 are disposed adjacent to a boundary of the opening area HLA.

The data routing lines are disposed along the circumference of the opening HL in the second opening area HLA2 while making a detour around the opening HL. The data routing lines intersect the vertical gate lines VG1 to VG4 in the second opening area HLA2 with at least one insulating layer interposed between them. For convenience of explanation, in the following description, the data routing line supplied with the data voltage is referred as to the data line along with the data lines respectively connected to both ends of the data routing line.

The horizontal gate lines HG1 to HG4 may not make a detour around the opening HL. The horizontal gate lines HG1 to HG4 function to transfer the gate pulse supplied from the vertical gate lines VG1 to VG4 to the corresponding pixel. Thus, because the pixel is not formed in the opening area HLA, the horizontal gate lines HG1 to HG4 may not need to pass by the opening area HLA. The embodiment of the invention is not limited thereto. For example, if the horizontal gate lines HG1 to HG4 make a detour around the opening HL in the opening area HLA, a size of the opening area HLA may increase. This may lead to a reduction in aesthetic impression of the display device. Thus, the horizontal gate lines HG1 to HG4 may be extended to the pixels adjacent to the opening area HLA toward the opening area HLA.

The data lines D1 and D6 disposed on an outermost side of the first opening area HLA1 and the vertical gate lines VG2 and VG3 disposed on an innermost side of the second opening area HLA2 are arranged in parallel with each other along the circumference of the opening HL in a partial area. Namely, the data lines D1 and D6 and the vertical gate lines VG2 and VG3 adjacent to the boundary GDL between the first opening area HLA1 and the second opening area HLA2 are arranged in parallel with each other in the partial area. The data lines D1 and D6 and the vertical gate lines VG2 and VG3 adjacent to the boundary GDL are disposed to be spaced from each other by the predetermined distance L1, so as to reduce a parasitic capacitance between the data lines D1 and D6 and the vertical gate lines VG2 and VG3 adjacent to the boundary GDL.

As described above, in the second embodiment of the invention, an area, in which the data lines D1 and D6 and the vertical gate lines VG2 and VG3 are arranged are adjacent to each other in the opening area HLA, is a portion in which the boundary GDL between the first opening area HLA1 and the second opening area HLA2 is defined. Namely, a size of the opening area HLA is greatly reduced, compared to a size of an area, in which the gate lines G1 to G6 (see FIG. 2) and the data lines D1 to D6 (see FIG. 2) are disposed in parallel with each other, when the gate lines G1 to G6 and the data lines D1 to D6 are alternately arranged while making a detour around the opening HL. In other words, the second embodiment of the invention is configured such that the data lines D1 and D6 and the vertical gate lines VG2 and VG3 are positioned adjacent to each other in a portion around the boundary GDL between the first opening area HLA1 and the second opening area HLA2. The second embodiment of the invention can limit an area, in which the data lines D1 and D6 and the vertical gate lines VG2 and VG3 are positioned adjacent to each other, to a portion around the boundary GDL by dividedly disposing the data lines D1 to D6 and the vertical gate lines VG1 and VG4.

Accordingly, the second embodiment of the invention can easily reduce a parasitic capacitance by securing the predetermined separation distance L1 between the data lines D1 and D6 and the vertical gate lines VG2 and VG3 adjacent to the boundary GDL. The second embodiment of the invention can a display device with improved aesthetic impression by reducing a size of the opening area HLA, that is a non-display area, while easily charging a predetermined pixel with a desired voltage level by reducing a parasitic capacitance between the signal lines arranged along the circumference of the opening HL.

The second embodiment of the invention described that only the data lines extended in the vertical direction are disposed in the first opening area, by way of example, but is not limited thereto. For example, the vertical gate lines extended in the vertical direction may be disposed in the first opening area while making a detour around the opening. In this instance, the data lines may be disposed in the second opening area while making a detour around the opening and may be intersected with the gate lines.

The embodiment of the invention can minimize a size of the opening area while reducing signal interference between the adjacent signal lines by employing a new line arrangement structure making a detour around the opening. Hence, the embodiment of the invention can prevent a reduction (for example, luminance non-uniformity) in the display quality of the display device and can improve the aesthetic impression by reducing a size of the opening area that is the non-display area.

Third Embodiment

Figure 13:
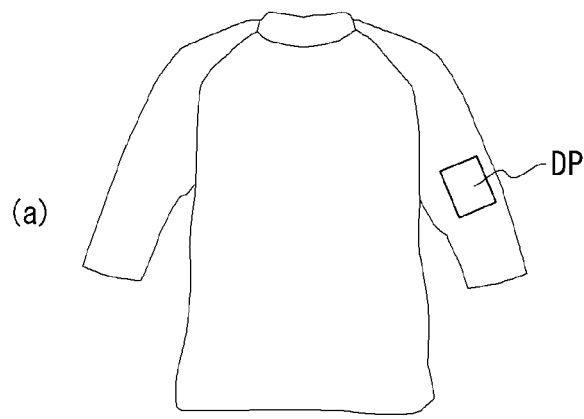
FIGS. 13 and 14 illustrate an application example of an embodiment of the invention.
Figure 13:
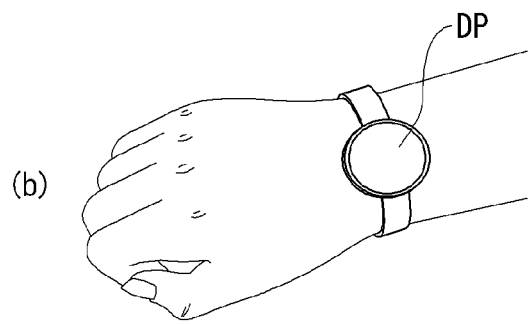
Figure 13:
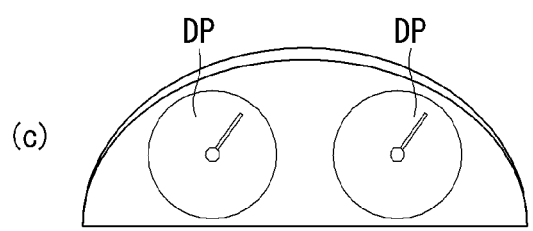
Figure 14:
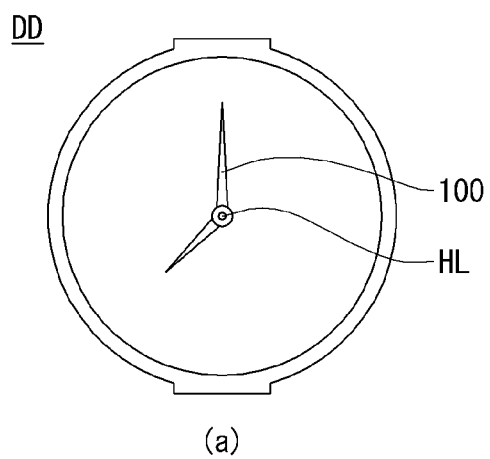
Figure 14:
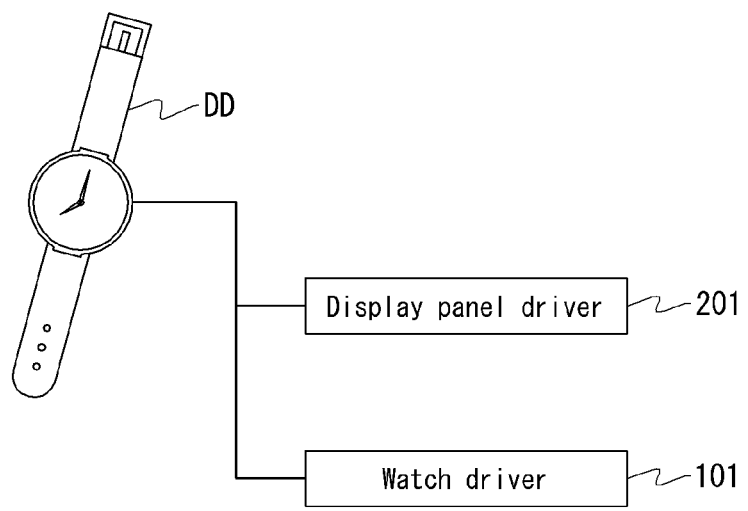

A display device according to a third embodiment of the invention is described below with reference to FIGS. 13 and 14. FIGS. 13 and 14 illustrate an application example of an embodiment of the invention.

Referring to FIG. 13, a study on a wearable display device DP a user wears on his or her body and a display device DP installed to a dashboard, etc. is being actively carried out recently. For example, a watch type display device DP, a glass type display device DP, etc. have been attempted. In order to apply these display devices DP to various fields, a display area may include an opening. Further, a display device DP may require a fastening structure for fixing the display device DP to user's clothes or a watch strap, etc.

The fastening structure may be formed in a bezel area NA (see FIG. 1) outside an active area AA (see FIG. 1). Alternatively, the fastening structure may be formed in the active area AA due to a structural limitation, design necessity, or a user demand Embodiments of the invention may be applied to various types of display devices, in which the opening is formed inside the active area AA.

Referring to FIG. 14, a display device according to an embodiment of the invention may be a watch type display device DD.

The watch type display device DD according to an embodiment of the invention includes a watch hand 100 in front of the display device DD and a watch driver 101 in rear of the display device DD. The watch hand 100 and the watch driver 101 are connected to each other through an opening HL.

The watch hand 100 may include an hour hand, a minute hand, and a second hand that rotate around a central axis passing through the opening HL. The watch driver 101 functions to drive the watch hand 100. The watch driver 101 drives the watch hand 100 in an analog manner. The watch driver 101 may operate using various known manners. For example, the watch driver 101 may be applied to a quartz movement watch in which a battery is a power source of a watch, a manual winding watch driven by a spring, an automatic watch sensing a movement of a watch housing, a tourbillon watch countering the effects of gravity, and the like.

The watch type display device DD separately includes a display panel driver 201 for driving pixels and the watch driver 101 for driving a watch. The display panel driver 201 and the watch driver 101 operate separately. The display panel driver 201 and the watch driver 101 may be interworked, if desired. However, the display panel driver 201 and the watch driver 101 basically operate separately. Thus, when a predetermined event (for example, a call transmission/reception via a radio communication unit, a message transmission/reception, information transmission/reception, etc.) is performed, the pixels are driven by the display panel driver 201. The watch hand 100 is driven by the watch driver 101, separate from the display panel driver 201.

The watch type display device DD thus configured may not need to drive the pixels so as to check time. Thus, the embodiment of the invention can reduce unnecessary power consumption of the display device DD and may not need to perform an unnecessary operation of the display device DD for checking time.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A display device comprising:
a substrate having an active area including a plurality of pixels, a bezel area outside the active area, and at least one opening area inside the active area;
at least one opening in the at least one opening area;
first signal lines arranged in a first direction and making a detour around the at least one opening in the opening area; and
second signal lines arranged in a second direction and making a detour around the at least one opening in the opening area,
wherein the at least one opening area includes:
a first opening area in which the detour of the first signal lines is exclusively arranged and which is located outside the at least one opening; and
a second opening area in which the detour of the second signal lines crossing the first signal lines is exclusively arranged and which is located outside the first opening area and the at least one opening.
2. The display device of claim 1, wherein the first direction is different from the second direction.

3. The display device of claim 2, further comprising:
data lines and gate lines configured to define the pixels through a crossing structure of the data lines and the gate lines;
a data driving circuit configured to supply a data voltage to the pixels through the data lines; and
a gate driving circuit configured to supply a gate pulse to the pixels through the gate lines,
wherein the first signal lines are one of the data lines and the gate lines, and the second signal lines are the other lines of the data lines and the gate lines.

4. The display device of claim 1, wherein the first direction is the same direction as the second direction.

5. The display device of claim 4, further comprising:
data lines, vertical gate lines, and horizontal gate lines configured to define the pixels through a crossing structure of the data lines, vertical gate lines, and horizontal gate lines;
a data driving circuit configured to supply a data voltage to the pixels through the data lines; and
a gate driving circuit configured to supply a gate pulse to the pixels through the vertical gate lines,
wherein two data lines are disposed at a first column boundary between a first pixel and a second pixel, that are adjacent to each other in a horizontal direction,
wherein one vertical gate line is disposed at a second column boundary between the second pixel and a third pixel, that are adjacent to each other in the horizontal direction,
wherein the horizontal gate lines are respectively connected to the vertical gate lines through contact holes penetrating at least one insulating layer with the at least one insulating layer interposed between them, and
wherein the first signal lines are one of the data lines and the vertical gate lines, and the second signal lines are the other lines.

6. The display device of claim 1, wherein a separation distance between the first signal lines in the first opening area is less than a separation distance between the first signal lines in the first opening area and the second signal lines in the second opening area that are closest to each other.

7. The display device of claim 1, wherein a separation distance between the second signal lines in the second opening area is less than a separation distance between the first signal lines in the first opening area and the second signal lines in the second opening area that are closest to each other.

* * * * *